United States Patent [19]

Sutterlin

[11] Patent Number: 5,008,632
[45] Date of Patent: Apr. 16, 1991

[54] TEMPERATURE COMPENSATED FEEDBACK CIRCUIT FOR SETTING AND STABILIZING AMPLIFIER DC BIAS POINTS

[75] Inventor: Philip H. Sutterlin, Durham, N.C.

[73] Assignee: International Business Machines Corporation, Armonk, N.Y.

[21] Appl. No.: 429,665

[22] Filed: Oct. 31, 1989

[51] Int. Cl.$^5$ .............................................. H03F 3/45
[52] U.S. Cl. .................................. 330/256; 330/258; 330/259
[58] Field of Search ........................ 330/256, 258, 259

[56] References Cited

U.S. PATENT DOCUMENTS

| | | | |
|---|---|---|---|
| 3,444,472 | 5/1969 | Johnson | 330/258 |
| 4,105,942 | 8/1978 | Henry | 330/258 X |
| 4,616,189 | 10/1986 | Pengue, Jr. | 330/258 X |
| 4,701,719 | 10/1987 | Nagata | 330/258 |
| 4,720,686 | 1/1988 | Westwick | 330/258 |
| 4,904,953 | 2/1990 | McCormack | 330/258 |

Primary Examiner—James B. Mullins
Attorney, Agent, or Firm—Joscelyn G. Cockburn

[57] ABSTRACT

Described is an improved differential amplifier arrangement with a temperature compensated feedback circuit which sets and stabilizes the DC bias point of the amplifier. The circuit averages the two outputs of the amplifier and generates a DC voltage which is compared with a reference voltage to generate a control signal which is amplified and is used to control the bias point of the amplifier.

1 Claim, 5 Drawing Sheets

TEMPERATURE COMPENSATED FEEDBACK CIRCUIT FOR SETTING AND STABILIZING AMPLIFIER DC BIAS POINTS

BACKGROUND OF THE INVENTION

1. Field of the Invention

The present invention relates to amplifiers in general and in particular to techniques and devices for controlling the operating point of said amplifiers without adversely affecting the amplifiers gain and/or bandwidth.

2. Prior Art

The quiescent output voltage of a differential amplifier is typically a function of a number of device parameters, such as tolerances, temperature and supply voltage. This variation is increased if one or more emitter or source followers are added to the output to increase drive capability of the amplifier.

Traditional techniques for improving the DC accuracy include the use of overall negative feedback. There are, however, undesirable side effects resulting from the use of overall feedback which cannot be tolerated in some applications. For example, applying negative feedback to an amplifier reduces its useful signal gain which may increase the need for additional gain stages if a desired gain is to be maintained. Negative feedback around multiple stages can then cause the need to "throw away" or discard high frequency gain by using various frequency compensation techniques. For this reason high frequency (video and RF) amplifiers often use localized feedback loops. If the high frequency amplifier has multiple stages, it usually requires multiple individual feedback loops. With multiple individual feedback loops the DC errors of each loop can accumulate into relatively large errors.

FIG. 1 shows another prior art technique which is used to improve an amplifier DC accuracy without compromising and/or sacrificing bandwidth. An input signal labeled $V_{IN}$ is applied to the negative input terminal of amplifier 10. The gain of amplifier 10 is set by resistors RF and Rin. The average DC value at the output of amplifier 10 is sampled by an integrator, formed from amplifier 12, $R_{int}$ and $C_{int}$, and applied to the non-inverting terminal of amplifier 10.

Even though the circuitry of FIG. 1 works well for its intended purpose, it has several drawbacks. First, the integrating feedback technique actually decreases the amplifiers DC gain. Second, the integrator must generally have a relatively long time constant. For a continuous time integrator an integrating capacitor within the range of tens of microfarads typically is required. This size capacitor would require a relatively large surface area and as such would be too large to be economically reproduced on an integrated circuit chip.

U.S. Pat. No. 4,621,238 uses a filtering circuit in a feedback loop for controlling the operating point of an amplifier. In particular, the differential output operating point of the amplifier is controlled by filtering the differential output and adjusting the current that is shared by a pair of differential devices.

SUMMARY OF THE INVENTION

It is the object of the present invention to provide a feedback loop which improves DC bias accuracy without sacrificing bandwidth and/or gain.

It is another object of the invention to provide an improved amplifier circuit arrangement.

The improved amplifier circuit arrangement includes a differential amplifier whose differential outputs are averaged to generate a DC signal which may be scaled to a desired level. The DC signal is compared with a referenced signal, generated from a reference circuit, to provide a control signal which is amplified and is used to control the amplifier bias point.

In an alternate embodiment a buffer stage is added to the output of the amplifier to provide a single-ended output signal. The temperature and process variation of the buffer is compensated for by including a like device within the reference circuit.

In another embodiment of the invention a relatively small capacitor (within the range of 1pF to 10pF) is inserted within the collector circuits of the differential pair devices. This compensates for any mismatch that may occur within the collector signals that are being averaged. Such a mismatch usually occurs at relatively high frequencies and if uncorrected the averaged signal would no longer be a DC signal.

The foregoing features and advantages of the invention will be more fully described in the accompanying drawings.

DETAILED DESCRIPTION OF THE PREFERRED EMBODIMENT

Figure 2:
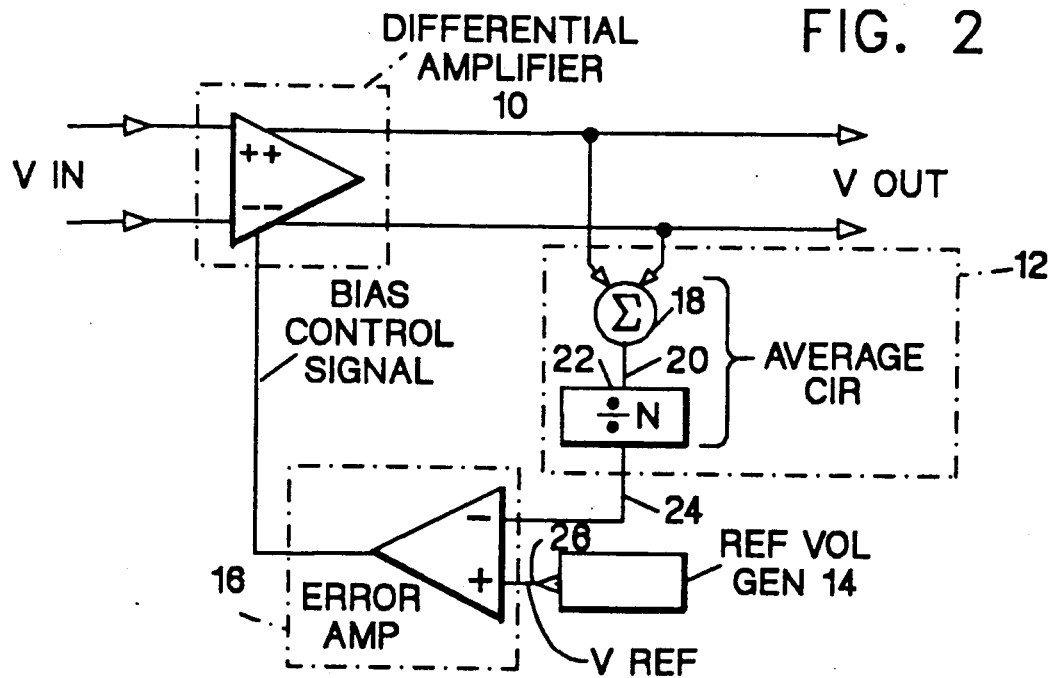
FIG. 2 shows a block diagram of an improved amplifier whose operating point is controlled according to the teachings of the present invention.

FIG. 2 shows a circuit arrangement of the improved amplifier according to the teaching of the present invention. The improved amplifier includes a differential amplifier 10 having a pair of inputs for receiving a differential input signal labeled $V_{IN}$ and a pair of outputs for generating a differential output signal $V_{out}$. A feedback loop processes the output signal and generates a bias control signal which is used to set the DC bias point of the differential amplifier 10. The feedback loop includes an averaging circuit 13, a voltage reference generating circuit means 14 and an error amplifier means 16. The averaging circuit means 13 includes a summing circuit 18 which adds the amplifiers' output signals and generates a signal on conductor 20. The signal on conductor 20 is equal to twice the common mode voltage of amplifier 10's output. Since amplifier 10 is functioning as a differential amplifier (with good common mode rejection), its common mode output voltage contains only DC components, which are a function of the amplifier's bias point. Stated another way, summing circuit 18 removes the AC component of $V_{out}$ and reproduces two times the DC component.

In a preferred embodiment of the present invention the DC signal on conductor 20 is applied to a divide by N circuit 22 which scales or adjusts the DC level of the signal on conductor 20 to a desired or predetermined signal level. In the preferred embodiment of this invention the DC signal on conductor 20 is scaled by a divide by 2 circuit. Of course, other types of scaling factors or circuitry can be used for adjusting the DC component of the signal without deviating from the scope or spirit of the present invention. The scaled signal from scaling circuit 22 is applied to the negative terminal of error amplifier 16 by conductor 24. A reference voltage generating circuit means 14 generates a reference signal Vref which is applied to the positive terminal of error amplifier 16 via conductor 26.

Reference generator 14 can be implemented using any one of several common temperature stable reference circuits. The preferred embodiment employs a band gap type of voltage reference generator.

Still referring to FIG. 2, the error amplifier 16 compares the scaled DC signal on conductor 24 with the reference signal on conductor 26 to generate a bias control signal which is amplified and supplied to the differential amplifier 10.

Figure 3:
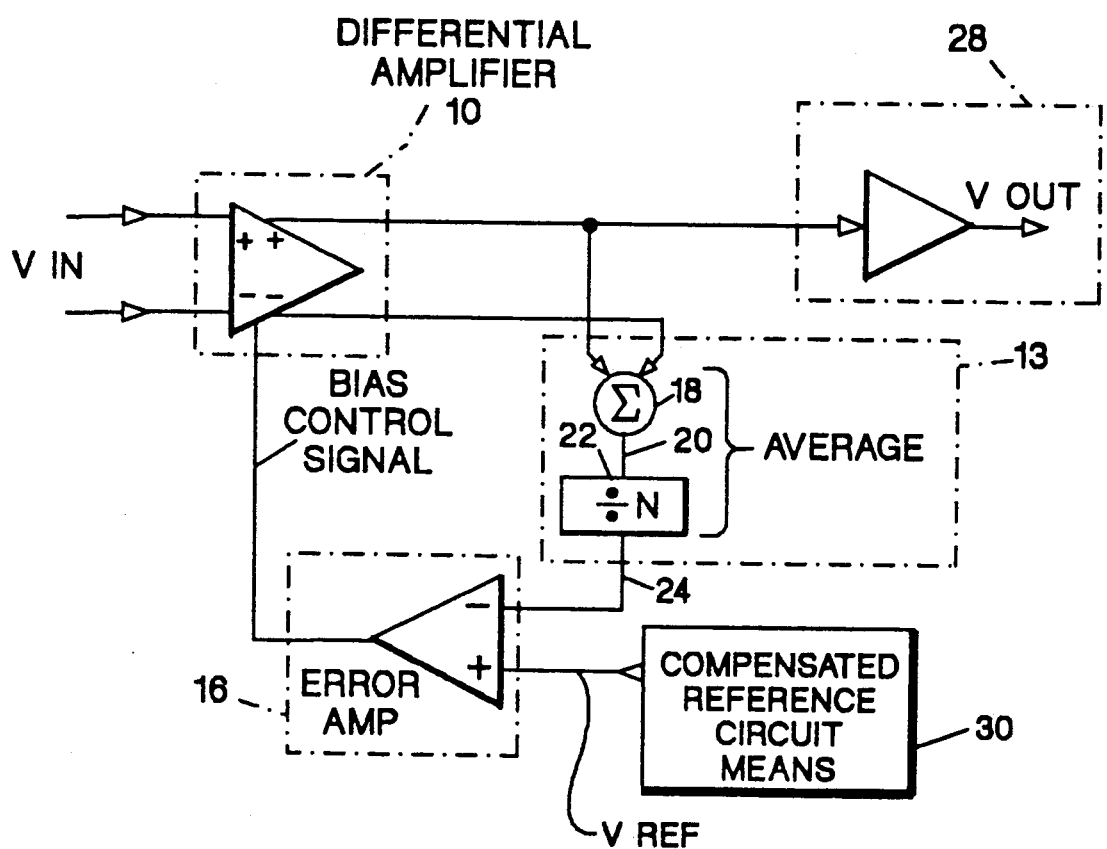
FIG. 3 shows a block diagram of the improved amplifier with a single-ended output.

FIG. 3 shows an alternate embodiment of the present invention wherein the output from differential amplifier 10 is converted into a single-ended output. Such single-ended output is often needed in amplifier design to drive an output load (not shown). Except for the circuit arrangement 28 which is used to buffer one side of the differential amplifier output to form a single-ended output, the compensated reference circuit means 30, the remaining portion of the circuit element in FIG. 3, is exactly like those in FIG. 2. Therefore, in both FIGS. 2 and 3 common numerals are used to identify like circuit components.

Still referring to FIG. 3, the circuit arrangement 28 provides a single-ended output signal labeled $V_{out}$. In the preferred embodiment of this invention, the circuit arrangement 28 is a unity gain (+1) buffer stage configured in a source or emitter follower configuration. Even though the emitter follower stage is outside the feedback loop, the benefits which the present invention provide are made available to this single-ended configuration when the compensated reference circuit means 30 is designed so that temperature and process variation of the circuit arrangement matches the temperature and process variation of the buffer stage 28.

Figure 4:
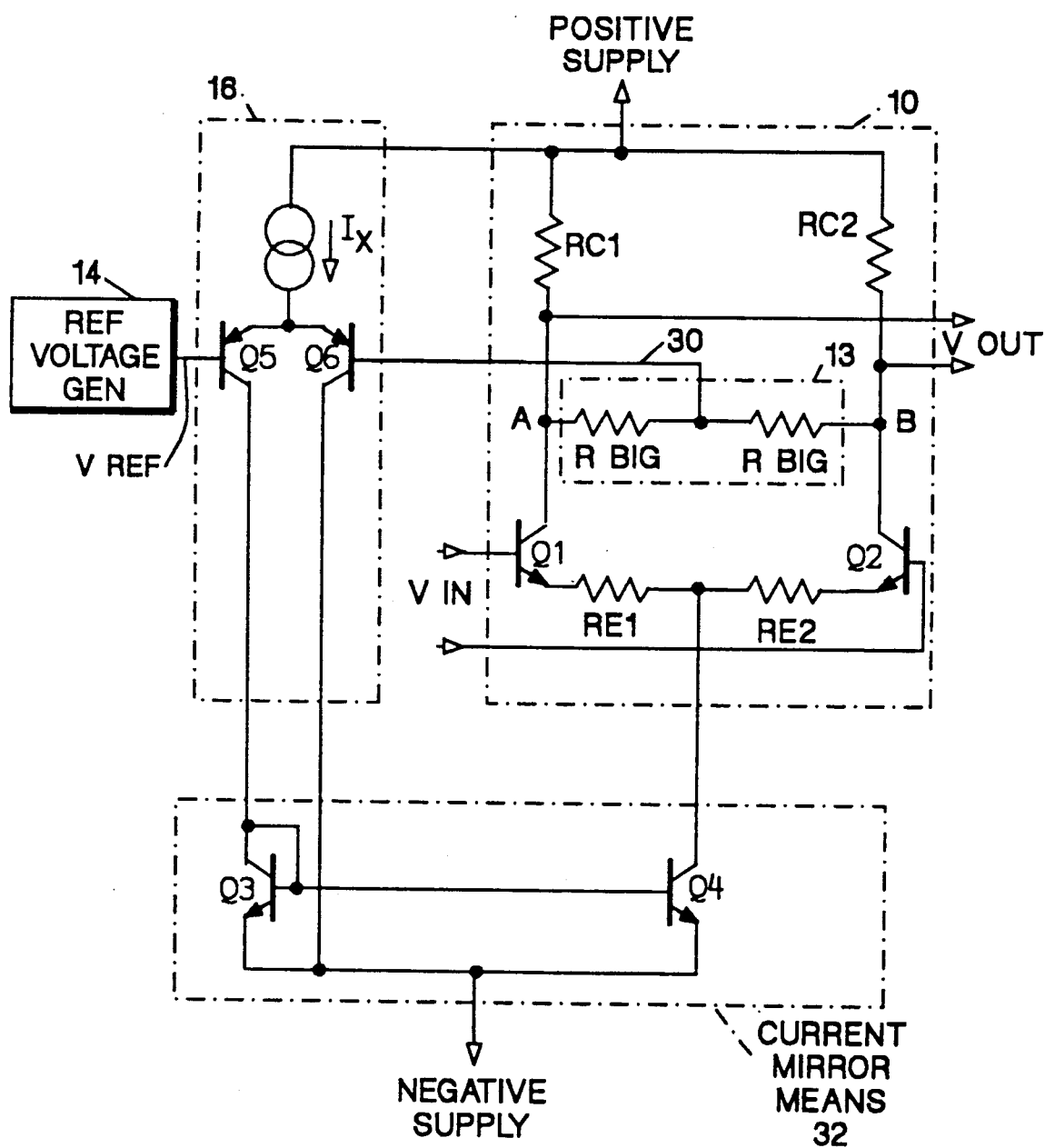
FIG. 4 shows a circuit diagram for the amplifier of FIG. 2.

FIG. 4 shows a circuit diagram for the improved amplifier schematic shown in FIG. 2. The circuit arrangement of FIG. 4 includes a power supply having at least a positive supply rail and a negative supply rail. The amplifier 10 is a single stage differential amplifier formed from components Q1, Q2, RE1, RE2, RC1 and RC2. RC indicates that the resistors are in the respective collector circuit of devices Q1 and Q2; while RE indicates that the resistors are in the emitter circuit of the respective devices. In the preferred embodiment of this invention RC1=RC2= 1200 ohms and RE1=RE2=225 ohms.

Still referring to FIG. 4, $V_{out}$ is a double-ended signal supplied on a pair of conductors. Each of the conductors is connected in the collector circuit of the respective differential devices Q1 and Q2. The averaging circuit means 13 is formed from a pair of series-connected resistors labeled $R_{BIG}$ and connected in the collector circuits of devices Q1 and Q2. The comparator and amplifier circuit 16 are formed by a pair of devices Q5, Q6 and a current source $I_x$ interconnecting the emitter terminal of devices 05 and Q6 to the positive rail of the power supply. A conductor labeled 30 interconnects averaging circuit 13 to the base of device Q6. Similarly, a conductor labeled Vref interconnects the base of device Q5 to the reference generating circuit means 14. A current mirror 32 interconnects the comparator means 16 to the differential amplifier and to the negative rail of the power supply. The current mirror 32 is formed from devices Q3 and Q4.

In operation, the signal labeled $V_{IN}$ is applied to the base terminals of devices Q1 and Q2. The resistors labeled $R_{BIG}$ take the average of the output signal appearing on nodes A and B, respectively. This average is then fed to device Q6 of the error amplifier which compares the average output to a signal Vref appearing on the base of device Q5. The difference between these signals is amplified and fed back through current mirrors Q3 and Q4 to control the amplifier bias point. In this way, the DC quiescent output voltage is regulated to be equal to $V_{reference}$.

Figure 5:
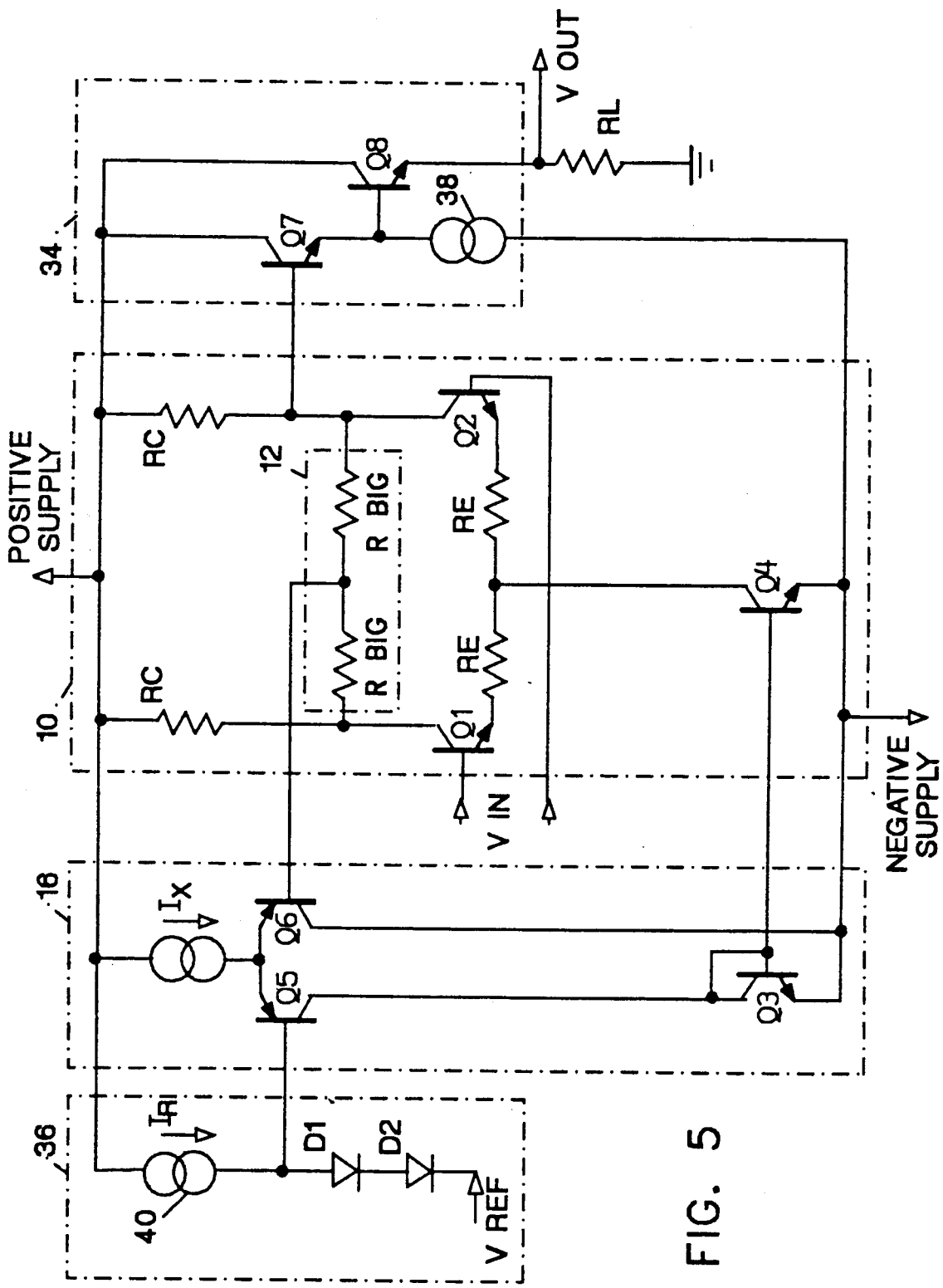
FIG. 5 shows a compensated stabilized circuit arrangement for the buffered single-ended amplifier.

FIG. 5 shows a circuit arrangement for the buffered single-ended amplifier of FIG. 3. As described relative to FIGS. 3 and 2, FIG. 5 and FIG. 4 are identical except for buffer stage 34 which is used to buffer one side of the differential amplifier output to form a single-ended output and the circuit arrangement 36 which compensates for variations caused by the buffer circuit 34. Thus, components in FIGS. 4 and 5 which are similar are labeled with common numerals. In addition, only circuit arrangements 34 and 36 will be described hereinafter, it being understood that the other components of FIG. 5 function the same as like components which have already been described relative to FIG. 4.

Still referring to FIG. 5, the circuit arrangement 34 which generates the single-ended output $V_{out}$ is comprised of devices Q7, Q8 and current source 38. The emitter electrode of device 37 is coupled to current source 38, its collector electrode is connected to the positive rail of the power supply and its base electrode is connected to the collector circuit of device Q2. Device Q8 is connected in an emitter follower configuration and is connected to device Q7. $V_{out}$ is taken from the emitter of device Q8 and the load which Q8 drives is represented by $R_L$. It should be noted that the emitter following configuration for the single-ended converting circuit arrangement 34 is only illustrative and should not be construed as a limitation on the scope of the present invention.

In addition to the circuit for generating the reference signal, $V_{ref}$, a circuit arrangement 36 is added to compensate for variations caused by circuit arrangement 34. The added circuit arrangement includes current source 40, devices $D_1$ and $D_2$.

Still referring to FIG. 5, devices Q7 and Q8 are buffered emitter followers used to provide high output current drive. Since their emitter base voltages vary with process and temperature and these devices are positioned outside of the feedback loop, the output DC operating point for the differential amplifier would always vary with process and temperature variations. To compensate for this variation, diodes D1 and D2 are coupled in the reference circuit and cancel the effects caused by devices Q7 and Q8. This cancellation is more effective if D1 and D2 are at the same temperature (near each other on the same chip) as Q7 and Q8. The diodes must also be operated at the same current density as devices Q7 and Q8. It should be noted that there are other types of circuits that can be added to compensate for variations caused by devices Q7 and Q8. Thus, the showing of diodes D1, D2 and current source 40 are only illustrative and should not be construed as a limitation on the scope of the present invention.

Figure 1:
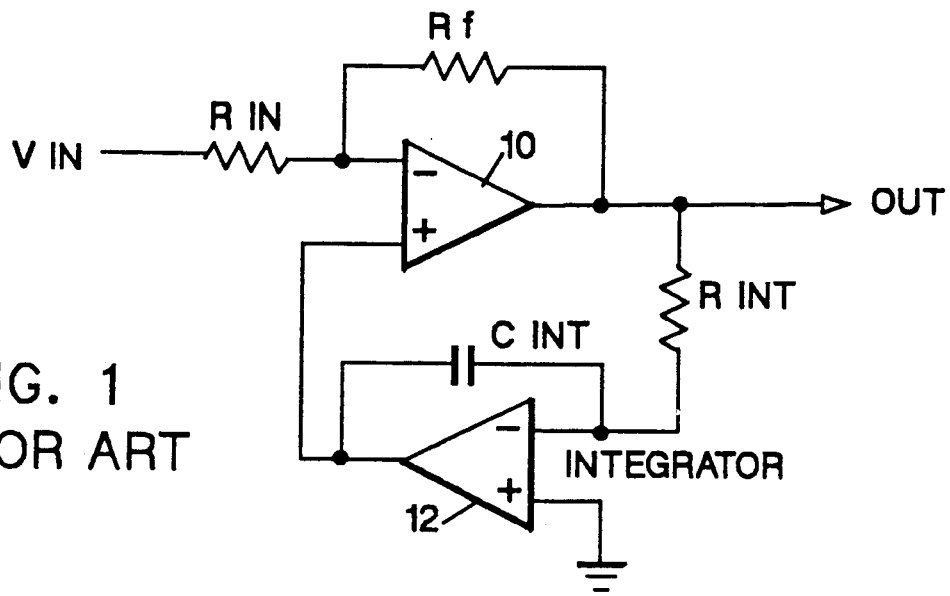
FIG. 1 illustrates a prior art technique wherein an integrating DC feedback loop sets the operating point of the amplifier.
Figure 6:
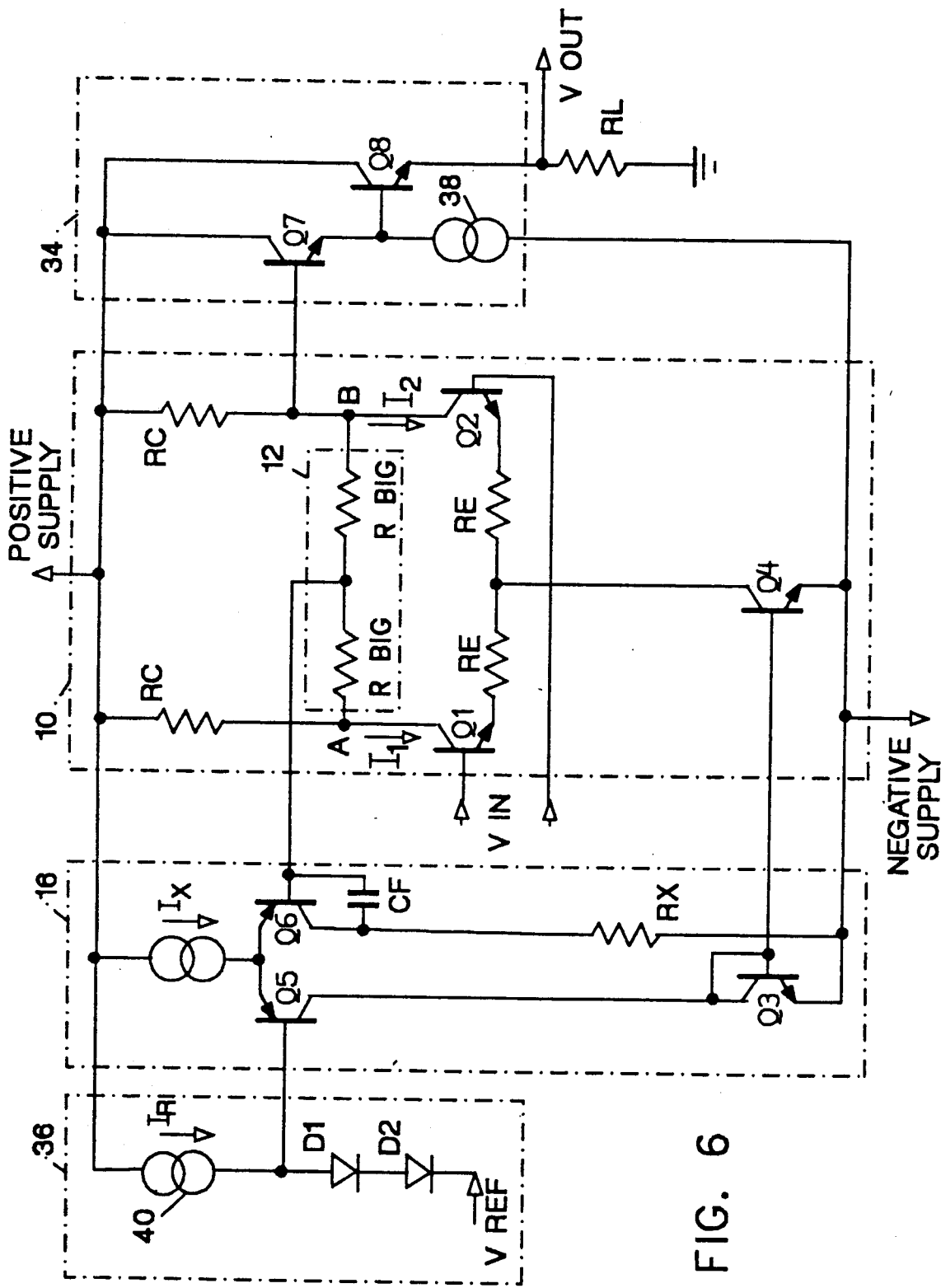
FIG. 6 shows the circuit arrangement of FIG. 5 with a miller multiplying filter that removes any residual high frequency signals resulting from a mismatch of the differential pair devices.

FIG. 6 shows an alternate embodiment according to the teachings of the present invention. In this embodiment a circuit is provided to compensate for any mismatch that may occur in the AC component of collector currents $I_1$ and $I_2$ of differential devices Q1 and Q2. This circuit includes a capacitor $C_f$ interconnecting the base of device Q6 to its collector terminal and resistor $R_x$ connected between the collector lead of device Q6 and the negative supply. Except for this capacitor and resistor, FIG. 6 functions exactly as FIG. 5. Also, the components in FIG. 6 are identical to the components in FIG. 5. This being the case, common numerals are used to identify like devices in FIGS. 5 and 6. In operation, there will not be a perfect match between the collector signals being averaged by average circuit means 13. At high frequency this is mainly due to differences in capacitive loading of nodes A and B, respectively. The average of the two nodes would then no longer be a DC signal. Since this error occurs at relatively high frequencies, a simple miller multiplying filter $C_f$ is formed with a small on-chip capacitor to filter out any residue left by this mismatch. Because $C_f$ is much smaller than the capacitor ($C_{INT}$) required for the prior art circuit of FIG. 1, the circuit of FIGS. 5 and 6 can be easily fabricated on an integrated circuit chip whereas the prior art circuit of FIG. 1 is not. This completes the detailed description of the present invention.

I claim:

1. An improved amplifier comprising:
   a differential amplifier stage having differential input devices ($Q_1$, $Q_2$) with a pair of differential input terminals for receiving an input signal, a pair of output terminals, interconnected collector terminals, and interconnected emitter terminals;
   a buffer stage, coupled to the pair of output terminals;
   a first circuit means connected in the interconnected collector terminals, said first circuit means averaging signals in said interconnected collector terminals and generating a single-ended signal representative of a DC component in said signals;
   a second circuit means for generating a reference signal (Vref);
   a third circuit means to compensate for temperature and process variations caused by said buffer stage, coupled to the second circuit means;
   an error amplifier coupled to the third circuit means for comparing Vref with the single-ended signal to generate a bias current signal which directly flows through (Q1, Q2) to set the DC operating point of said differential amplifier stage.

* * * * *